United States Patent [19]
Beilstein, Jr. et al.

[11] Patent Number: 5,309,318
[45] Date of Patent: May 3, 1994

[54] THERMALLY ENHANCED SEMICONDUCTOR CHIP PACKAGE

[75] Inventors: Kenneth E. Beilstein, Jr., Essex Junction; Claude L. Bertin, South Burlington; Gordon A. Kelley, Jr., Essex Junction; Christopher P. Miller, Underhill, all of Vt.

[73] Assignee: International Business Machines Corporation, Armonk, N.Y.

[21] Appl. No.: 109,016

[22] Filed: Aug. 18, 1993

Related U.S. Application Data

[63] Continuation of Ser. No. 871,456, Apr. 21, 1992, abandoned.

[51] Int. Cl.$^5$ .............................................. H05K 7/20
[52] U.S. Cl. ..................... 361/689; 165/104.33; 437/915; 439/485; 361/699; 361/790
[58] Field of Search .................... 29/830, 840; 437/51, 437/208, 915; 165/80.3, 80.4, 104.33; 257/712-714, 720, 723, 724; 174/252, 260-263; 439/55, 59, 61, 65, 68-71, 74, 485; 361/689, 690, 694.5, 696, 699, 700, 704, 705, 707, 709, 717-721, 735, 744, 767, 770, 773, 778, 784, 790, 792

[56] References Cited

U.S. PATENT DOCUMENTS

| | | | |
|---|---|---|---|
| 4,254,447 | 3/1981 | Griffis | 361/386 |
| 4,706,166 | 11/1987 | Go | 361/403 |
| 4,727,410 | 2/1988 | Higgins, III | 357/74 |
| 4,731,701 | 3/1988 | Kuo | 361/388 |
| 4,764,846 | 8/1988 | Go | 361/388 |
| 4,868,712 | 9/1989 | Woodman | 361/388 |
| 4,983,533 | 1/1991 | Go | 437/7 |
| 5,016,138 | 5/1991 | Woodman | 361/396 |
| 5,019,943 | 5/1991 | Fassbender | 361/396 |
| 5,081,063 | 1/1992 | Vonno et al. | 437/180 |
| 5,104,820 | 4/1992 | Go | 437/51 |
| 5,159,530 | 10/1992 | Komoto | 361/704 |

FOREIGN PATENT DOCUMENTS

| | | |
|---|---|---|
| 0206696 | 12/1986 | European Pat. Off. . |
| 0354708 | 2/1990 | European Pat. Off. . |
| 0479205A2 | 4/1992 | European Pat. Off. . |
| 2354260 | 6/1974 | Fed. Rep. of Germany ...... 361/385 |

OTHER PUBLICATIONS

Tepper, "Packaging or a Large Memory System", IBM Technical Disclosure Bulletin, vol. 17, No. 4, Sep. 1974, pp. 987-988.

Chrysler, G. M. et al., "Direct Liquid Cooling of Computer Chips Using a Densley Packed Pin Fin Array and Controlled Radial Flow of a Dielectric Coolant," Research Disclosure, Dec. 1990, No. 320. Kenneth Mason Publications, Ltd., England.

Tuckerman, David B., "Heat-Transfer Microstructures for Integrated Circuits," Ph.D. Thesis, Feb. 1984. UCR-L-53515. Lawrence Livermore National Laboratory.

*Primary Examiner*—Gerald P. Tolin

[57] ABSTRACT

A structure and method is disclosed for cooling a semiconductor computer chip module. The semiconductor computer chip module is made up of a plurality of semiconductor chips bonded together In one aspect of the present invention every other chip is staggered such that recesses are formed between protruding edges of every other chip along two opposite faces of the chip module. The opposite faces with the staggered chips are capped and sealed so that coolant channels are formed between the recesses and the sealing caps. In another aspect, one face of the chip module is bonded by a plurality of connectors to a base. The base and chip module with connectors form a chamber. The chamber is sealed and an opening is made in the base to circulate coolant into and around the connectors of the base and up along the coolant channels which are in fluid communication with the base. Thermal vias are provided between selected connectors and the chip module to conduct heat from the chips of the module to the connectors.

25 Claims, 4 Drawing Sheets

THERMALLY ENHANCED SEMICONDUCTOR CHIP PACKAGE

This application is a continuation of application Ser. No. 07/871,456, filed Apr. 21, 1992, now abandoned.

TECHNICAL FIELD

The present invention relates to high density packages containing multiple integrated circuit (IC) semiconductor chips bonded together to form a module. More particularly, it relates to various structures and methods of enhancing the thermal conductivity of such IC chip modules to efficiently cool them during operation.

BACKGROUND ART

Fabrication of computer circuitry of increasingly smaller size has been one of the driving forces in the development of computers since their inception. Laptop computers available today have higher processing speeds and more power than a computer which filled an entire room in the late 1940's and early 1950's.

The demand for more powerful and smaller computers for a multitude of applications will continue to spur the computer industry to reduce the size of computers and their components. Also, with the development of increasingly more powerful, faster and more complex computers, the need to limit propagation delays caused by the distance a signal must travel between components of a computer system will become of more concern to the industry. In the near future, propagation distances of several centimeters between components of a computer system may create limits to the operation of a computer system which can only be resolved by further reductions in size.

Bonding of multiple stacked semiconductor chips together into a module is one method under development to reduce the physical area taken up by a computer and its circuitry and to reduce propagation delays. The module of bonded chips, sometimes referred to as a "cube," usually takes the form of a right parallelpiped. The chips as bonded together in the module have connectors distributed on one face of the module to connect the module to a base or carrier, both physically and electrically.

The high chip density of such modules present other problems. One of the primary problems to be resolved is the elimination of the excess heat generated by operation of the chips in such close proximity in the module.

The temperature range over which a silicon chip, fabricated by present day methods, can operate in a fairly safe manner is from 20° to 120° C. However, given the power consumption of many of these chip modules, temperatures of the module can easily exceed the 120° C. limit of a silicon chip if not properly cooled. Moreover, silicon chips operate most effectively and efficiently in a temperature range of from 20° to 40° C. Similarly, the temperature of a module made up of chips of gallium arsenide can easily exceed 170° C., the safe operating limit of gallium arsenide chips.

Failure to properly control the temperature of a module can result in degradation of, and destruction of, the electronic circutry devices on the chips. Excessive heat can also affect the efficiency of operation, even if it does not result in outright destruction of the components of the chips. Thermal expansion of the module and chips, although not of a sizable amount, can also cause serious harm and damage to the module and chips which form the structure of the module if not properly controlled.

Thermal analysis of the operation of semiconductor chips indicates that the temperature difference between the center of the chip and its edge will by only a few degrees and that the chip itself can transmit temperature difference from its center to its edges in a fairly efficient manner. Thus, the challenge is to adequately cool the chips when combined in a module to maintain an operational temperature within the most effective and safe ranges for chips of the module.

DISCLOSURE OF THE INVENTION

The present invention addresses the above noted problem of excessive heat by providing a means to enhance the thermal conductivity and heat dissipating capacity of a chip module containing a multitude of chips bonded together.

Further, it is an object of this invention to provide a simple and effective structure for cooling a chip module that is economical to manufacture, maintenance free during operation and durable.

The limitations of the prior art are overcome and objects of the invention are achieved through the provision of an integrated circuit semiconductor chip module with an enhanced cooling structure. A plurality of integrated circuit semiconductor chips are bonded together face to back or face to face in a stack which forms the chip module. The chip module is generally in the shape of a right parallelpiped, i.e., a six-sided figure with sides or faces that are rectangular. Adjacent to a first face of the chip module is a base. The base and module are separated by a short gap. A plurality of connectors is provided on the first face of the module. The connectors span the gap to physically and electrically connect the first face of the module to the base. In accordance with a first aspect of the present invention, means are provided for circulating a coolant between the base and the chip module around the connectors.

The connectors between the base and chip module may be solder bumps. Some of the solder bumps have between them and the chip module, thermal vias through which heat can be transmitted from the chips of the module to the solder bumps and then into the coolant circulating around the solder bumps.

In another form of this invention the chips making up the module are formed into a staggered array so that every other chip protrudes out from the module along one of two opposite faces of the module. The staggering of the chips forms recesses between successive protruding chip edges on each of two opposite faces of the module. Caps placed over the two opposite faces, convert these recesses into channels through which coolant can be circulated.

In a further aspect of the present invention, the thermal vias of selected solder bumps and coolant flow around the solder bumps, are combined with the coolant channels formed by the staggered chip array structure. This combination allows coolant to be circulated around the solder bumps between the base and chips of the module and up through the coolant channels on the sides of the module.

BRIEF DESCRIPTION OF DRAWINGS

The foregoing and other objects, features and advantages of the invention will be apparent from the following, more particular description of preferred embodiments of the invention as illustrated in the accompanying drawings in which.

BEST MODE FOR CARRYING OUT THE INVENTION

Figure 1:
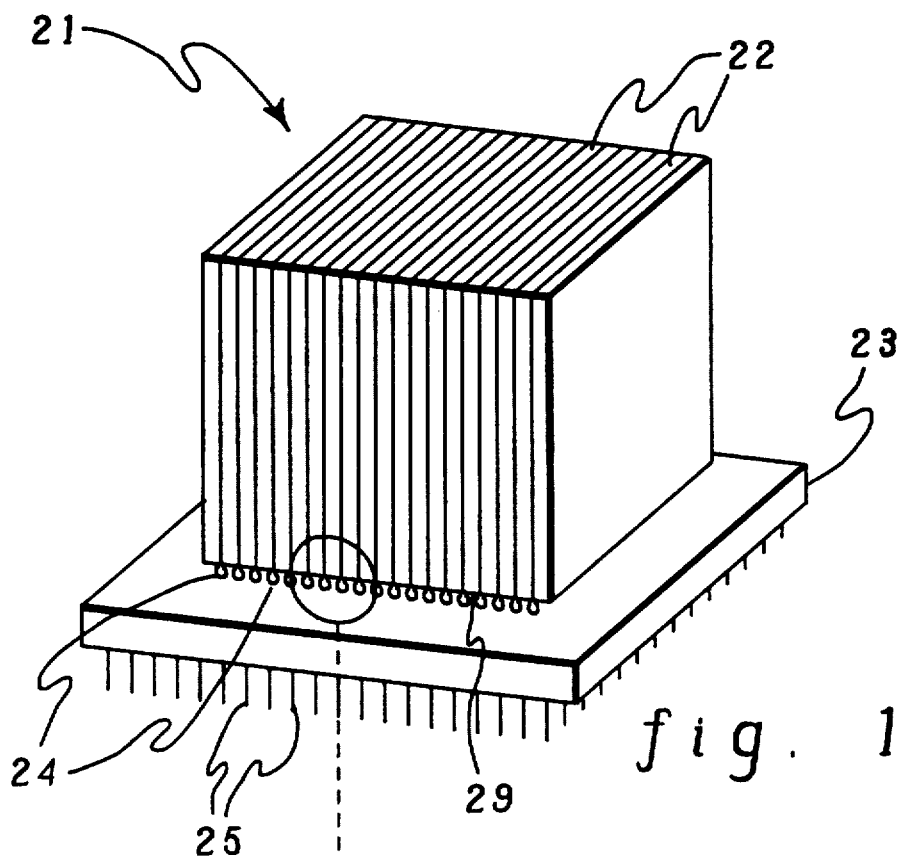
FIG. 1 is a perspective view of a chip module attached to a base.

FIG. 1 depicts one form of a chip module and associated base. The chip module 21 is made up of multiple chips 22, perhaps fifty or more. The chips 22 are stacked face to back or face to face and physically connected or bonded together by an appropriate means. Adhesives such as polyepoxy may be used for this purpose. The electronic circuitry and connecting circuitry (not shown) for the chips 22, run down between the chips towards a base 23. Such circuitry between the bonded chips would consist of a layer or layers of metalization and perhaps insulating layers. The techniques for creating these layers is well-known in the industry. Contact between the chips 22 of the module 21 and the base 23 would be through connectors 24 located at the face of the chip module 21 adjacent to the base 23.

Generally, the chip module has the form of a right parallelepiped, i.e., a geometrical structure that has six (6) faces which are square or rectangular. The parallelepiped structure 21 will be referred to herein as the chip module or simply the module. However, other geometrical forms of the module are possible without departing from the spirit of the present invention. The combination of module 21, base 23, and other structures to be described will be referred to as the semiconductor chip package.

The chips 22 of the chip module 21 could be made of silicon, gallium arsenide, or any other acceptable material for a semiconductor chip. The chips 22 making up the module could be memory chips, processors, or any other type of semiconductor chips used in a computer. Each individual chip 22 could be a standard semiconductor chip commercially available and set in a holder or frame of some kind or specially manufactured chips sized and configured to be bonded to other chips in a module 21.

The base or carrier 23, is composed of a ceramic material or any other suitable material which can form a suitable support for the module 21. As noted above, the module 21 is connected to the base both physically and electrically by connectors 24. The connectors 24 are preferably solder bumps. The use of solder bumps, (also known as C4 joints) is common in the industry. The solder bumps can be composed of any number of different types of material, the most common composition used in the industry is an appropriate blend of lead and tin.

Figure 1A:
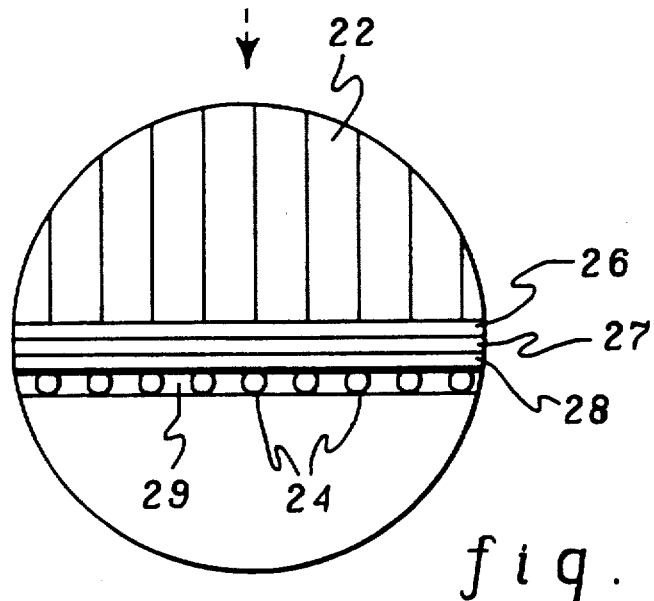
FIG. 1A is a cross-sectional view of a portion of the area between the chip module and the base.

FIG. 1A provides a closeup, cross-sectional view of a small portion of the area between the module 21 and the base 23. Depicted are the solder bumps 24, as well as various insulating layers and an electrical conductive layer which would normally be found between the solder bumps and the chips 22 of the module 21. Layer 26 is an electrical insulating layer, formed of a common material used as an insulator such as polyimide. Another material that could be used is aluminum nitride. However, polyimide, a flexible and resilient material which can be readily applied to the exterior surface of the module is one of the most popular commercially available insulating materials at present.

The second layer 27 is a metalized layer that is familiar and extensively used in the art, and has electronic conducting bands running through it. The bands would naturally penetrate layer 26 at the appropriate place to make electrical contact with leads, not shown, coming off of each of the chips 22. Layer 28 is another electrical insulating layer applied to isolate and protect layer 27. The electrically conductive bands of layer 27 penetrate layer 28 at the appropriate spot to make contact with one or more of the solder bumps 24. The space or gap 29 between solder bumps 24, might, in other applications, be filled with an insulating material but, for purposes of this invention, is left open to accommodate coolant flow.

Solder bumps 24 support module 21 on base 23. The solder bumps 24 thus form the physical contact between the module 21 and base 23. By their size, the solder bumps 24 keep module 21 and base 23 separate, thereby creating gap 29.

Solder bumps 24 also provide the electrical connections between module 21 and base 23. Lines for electrical contact run from the solder bumps 24 through base 23 to the connecting pins 25 depicted in FIG. 1. The connecting pins are set up in a pingrid array pattern, a common method for connecting devices in the industry. However, there are a number of other standard means well-known in the industry for connecting the base both physically and electrically to the rest of the computer system.

One or more additional insulating layers or metalized layers for conducting purposes can be added between the solder bumps 24 and the first face of the module 21. The number of layers, their thickness and composition are determined by the intended application of the chip module. Such layers and their use are familiar in the art. Although the description of the preferred embodiment herein only refers to the minimum number of layers normally needed, the principles of the present invention could readily be extended to structures having a different number or arrangement of layers between the module 21 and solder bumps 24.

Figure 2A:
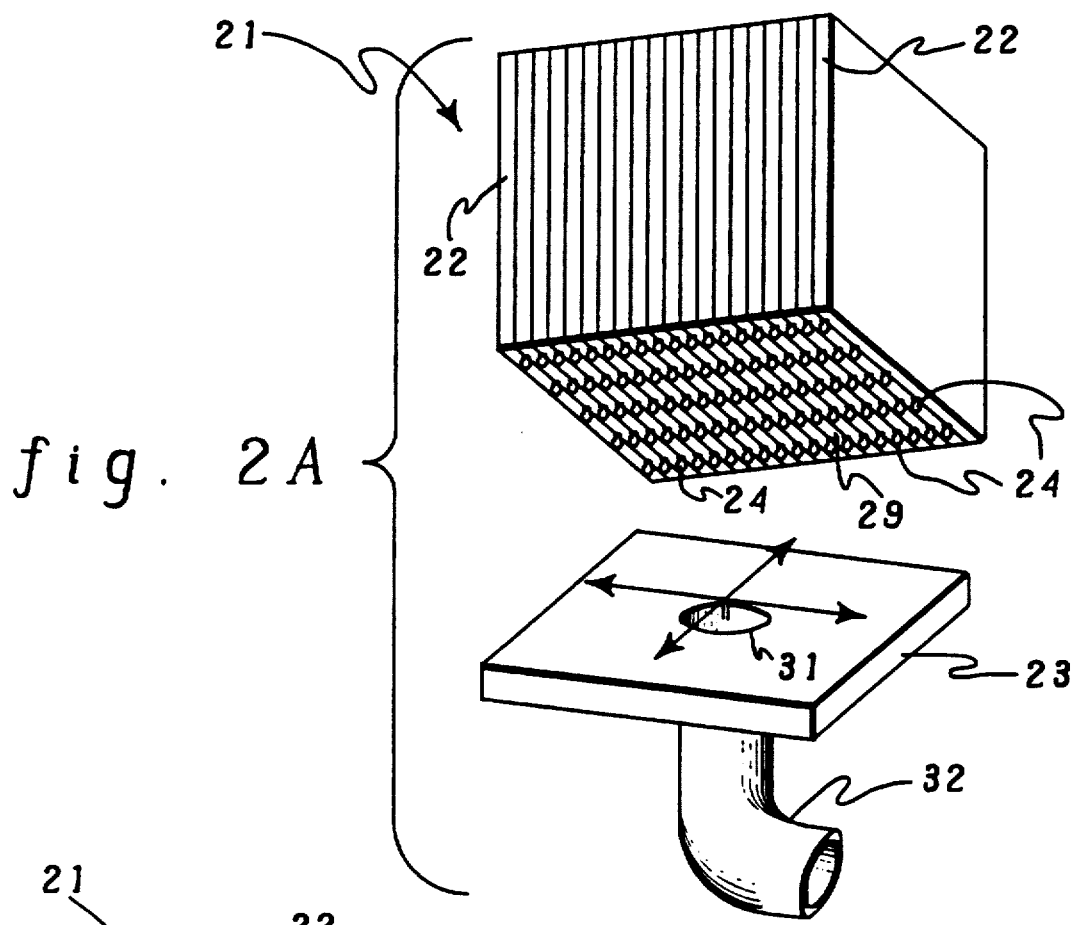
FIG. 2A is an exploded view of the chip module and base including means for injecting coolant therebetween.
Figure 2B:
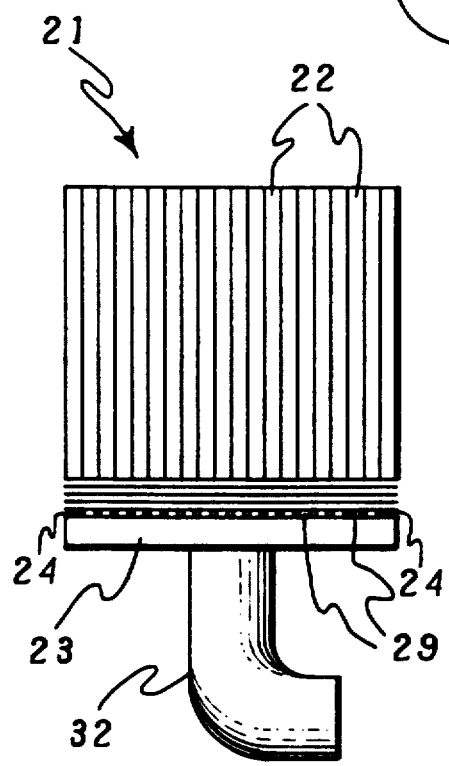
FIG. 2B is an elevational view of the module and base of the present invention.
Figure 2C:
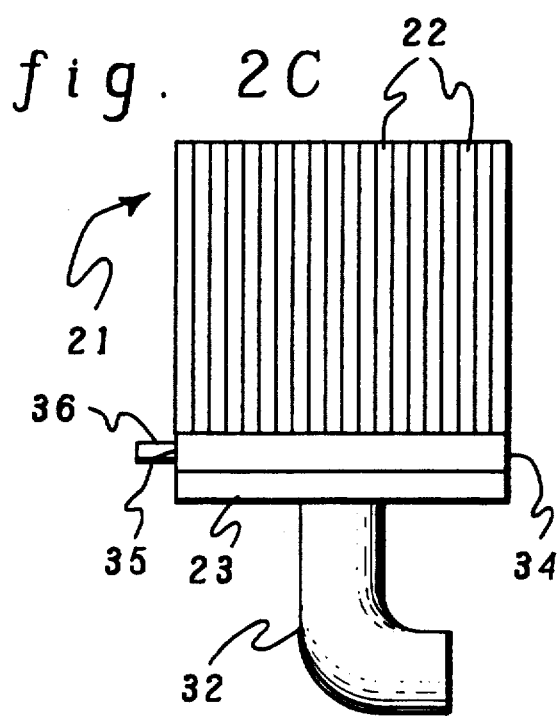
FIG. 2C is an elevational view of the module and base with one means to circulate coolant.

FIG. 2A an exploded view of the base 23 and module 21, depicts one means for cooling the module. A conduit or pipe 32 can be used to inject a gas or fluid coolant through opening or nozzle 31 into gap 29. The gas or fluid coolant would then flow in gap 29 between the solder bumps 24 and draw heat away from the module through the solder bumps and along the face of the module adjacent to the base 23. The coolant could then be collected at the edges of chamber 29 and circulated through a refrigeration unit or some other means to extract excess heat, and then recycled through conduit 32. FIG. 2C depicts one method of circulating coolant through gap 29. A seal 34, resting on base 23, is placed along the edge of the first face of the module 21, surrounding gap 29, turning gap 29 into a sealed chamber. An opening 35 in the seal 34 has a conduit 36 attached to it. Both conduits 36 and 32 are attached to an appropriate mechanism to extract heat from a coolant such as a refrigeration unit (not shown). A pressure differential created between the opening in the base and the opening in the seal causes coolant to flow between the openings around the solder bumps in gap 29. The coolant can be freon, liquid nitrogen, water, air or any other coolant suitable for the task.

The solder bumps 24 providing the physical and electrical connection between the module 21 and the base 23 serve one of four different functions:

a) transmission of electrical signals to or from the chips of the module,
b) transmission of power to the various chips of the module,
c) creation of a DC potential for various reasons, or
d) providing only physical support.

One of the problems with the present technology is that the best materials available for use as the insulating layers tend to be poor thermal conductors. Insulating layers are depicted at 26 and 28 in FIG. 1A and as 44 in FIG. 3A. Polyimide, a resilient and flexible material, is a popular insulator used on computer chips and modules. Polyimide has a low dielectric constant and thus is an excellent electrical insulator. Polyimide is also readily available commercially at a reasonable price and can be easily applied in a controlled and precise manner to the necessary thickness for the purpose intended. However, polyimide has extremely low thermal conductivity characteristics. In contrast aluminum nitride, another available insulator with reasonably high thermal conductivity, is not as versatile and effective as polyimide. Aluminum nitride, for instance, cannot be easily applied in a thick enough layer for many applications.

The importance of the insulating layer and its effectiveness as an electrical insulator is a significant factor in module fabrication. The solder bumps 24, which are used to transmit signals to and from the module, must be adequately electrically insulated from the module to avoid elevated capacitance and electrical interference with the portion of the module directly adjacent to the solder bump 24. At present there are no suitable electrical insulators available which have a high enough thermal conductivity and also can provide sufficient electrical insulation to properly isolate the solder bumps carrying electrical signals.

All the solder bumps have to be insulated in some way from the module to prevent the chips of the module from shorting out. However, as noted above, only those solder bumps used to transmit signals require a significant amount of electrical insulation. The rest of the solder bumps 24 used for the other purposes noted above, of which there are a significant number, require substantially less insulation. This fact is recognized and employed in the present invention to enhance the thermal conductivity from the module to the solder bumps through the creation of thermal vias. The thermal vias are electrically insulating, but thermally conductive paths from the module to various solder bumps. Obviously then the coolant flowing around the solder bumps provides an even more efficient means to extract heat from the module. Thermal vias, or paths of high thermal conductivity, are created at the solder bumps 24 used: to create a DC potential, to provide power or to provide only physical support. The solder bumps used for transmission of signals do not have thermal vias.

Figure 3A:
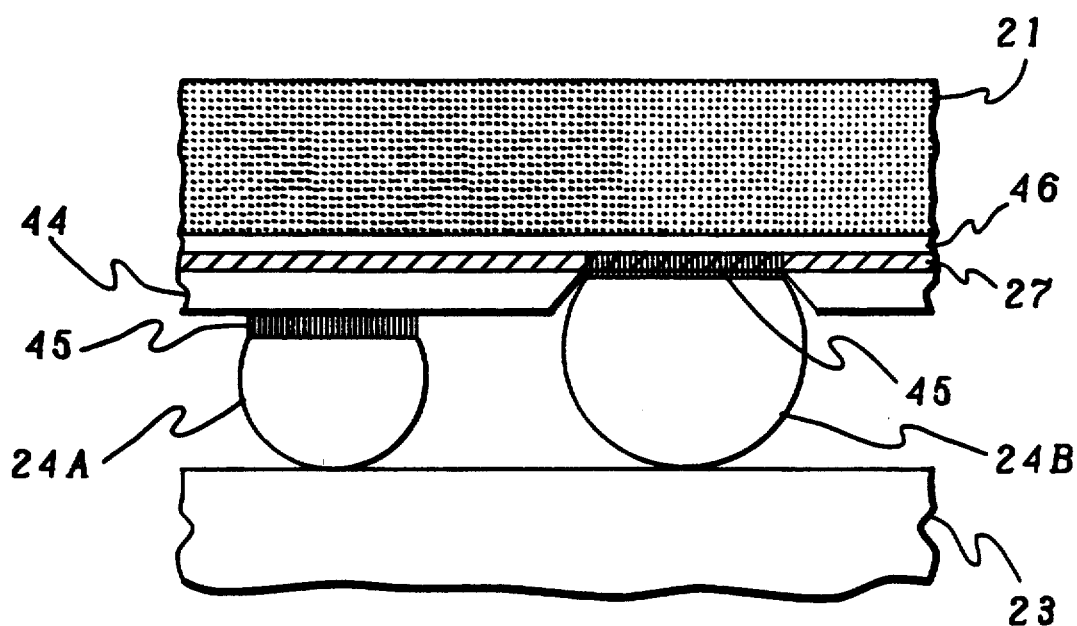
FIG. 3A is a magnified view of two different solder bumps and the surrounding structures.

FIG. 3A depicts a solder bump 24A, above which there is no thermal via, and a solder bump 24B, above which one form of a local thermal via has been created. The solder bump 24A is one that is used for an electrical signal. The solder bump 24A connects to electrical contact 45. At some point, electrical contact 45 would penetrate through the adjacent insulating layer 44 to connect to a bus, not shown, located in layer 27. The bus runs between insulating layer 44 and layer 46 which is also an insulating layer. Eventually, the bus penetrates layer 46 and makes contact with the appropriate connections to the various chips of the module.

The bus forms a maze of electrical conductive paths in layer 27 between the insulating layers 44 and 46. The bus penetrates the insulating layers 44 and 46 at the appropriate spots to provide the electrical contacts between the appropriate solder bumps 24 and connections to the chips 22. Depending on the complexity and amount of circuitry, additional insulating layers could be added to isolate additional layers of metalization to form a more complex bus. The bus and its connections are not depicted since such buses, their connections, and the metalized layers they are embedded in, are common knowledge in the art and graphic depiction is unnecessary to convey the concepts of this invention.

Layer 44, between solder bump 24A and the module 21, is an electrical insulator with low thermal conductivity characteristics, such as a polyimide. Layer 46, also an electrical insulating layer, has a high thermal conductivity and could be aluminum nitride. The thermal via above solder bump 24B, is created by removal of the low thermal conductivity electrical insulator, layer 44. This would still leave electrical insulating layer 46 which has a high thermal conductivity. Solder bump 24B is used for support, transmission of power or to create a DC potential. If it is used for power or DC potential, then the bus would obviously be connected to the solder bump 24B at contact 45.

Figure 3B:
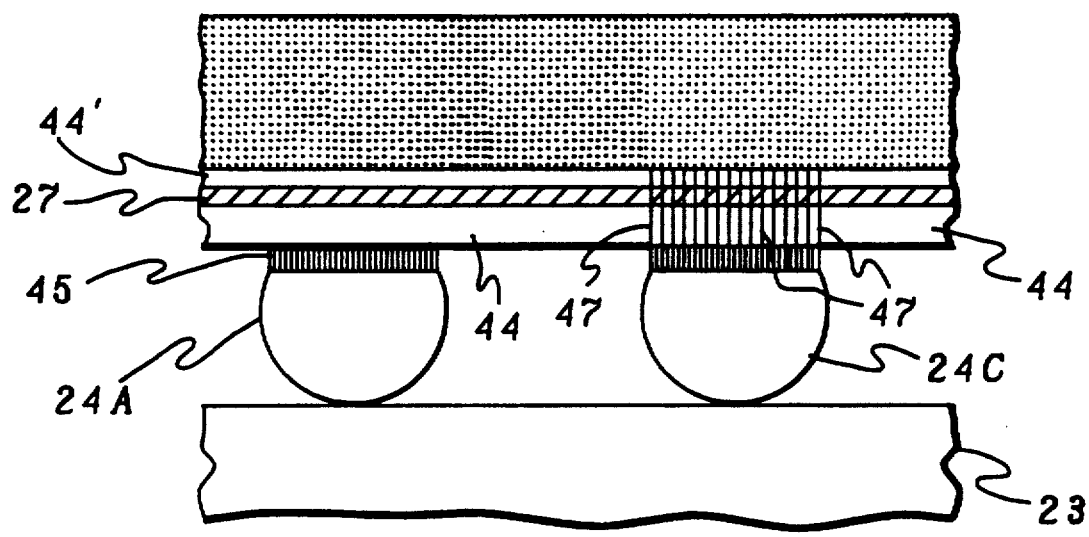
FIG. 3B presents a magnified view of another embodiment of the two different solder bumps and the surrounding structures.

FIG. 3B illustrates another approach to creating a desired local thermal via above a solder bump. In FIG. 3B, solder bump 24A is used for transmission of signals and thus there is no change in the electrical insulating layers 44 and 44' located between the solder bump 24A and the module 21. As previously described with respect to FIG. 3A, contact 45 connects solder bump 24A to the bus in layer 27. However, solder bump 24C has created between it and the module 21, a high thermal conductivity region 47. Region 47 serves as a local thermal via and is created by altering or modifying the low thermal conductivity of layers 44 and 44' just above bump 24C into a region of high thermal conductivity while maintaining the electrically insulating quality of the layers. The area 47 of high thermal conductivity can be created by enhanced localized curing, ion implantation or any other suitable technique used in the fabrication of semiconductors to alter material.

Figure 4:
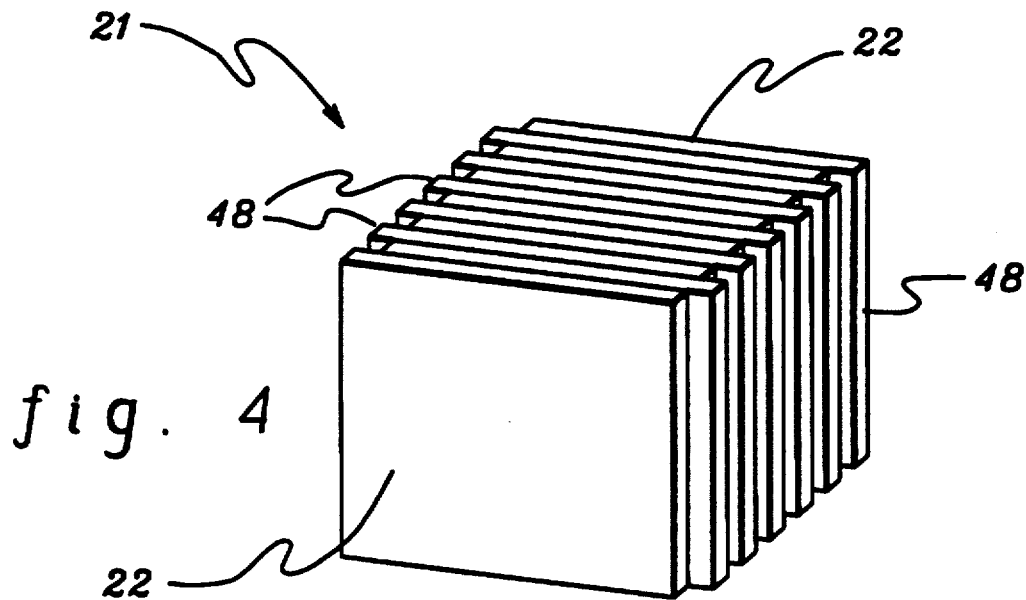
FIG. 4 is a perspective view of the chip module with the chips being set off-center or staggered with respect to adjacent chips.

FIG. 4 depicts an arrangement by which the cooling properties of the module 21 can be further enhanced. The chips 22 in FIG. 4 have been alternately set off-center or staggered from each other so that one edge of each chip sticks out along one of two opposite faces of the module. These protruding edges add additional means for conducting heat away from the module. The staggering of each chip creates recesses 48 between alternating chips along the two opposite faces of the module, as depicted in FIG. 4. The protruding edges act like cooling fins.

The structure depicted in FIG. 4 can be further enhanced to provide a more efficient cooling effect. Referring to the plan view of FIG. 5A caps 51 are placed over the two faces of the module which have the protruding chip edges. The caps 51 thus seal the inter-chip recesses 48 creating channels 49 along which coolant can flow.

Figure 5A:
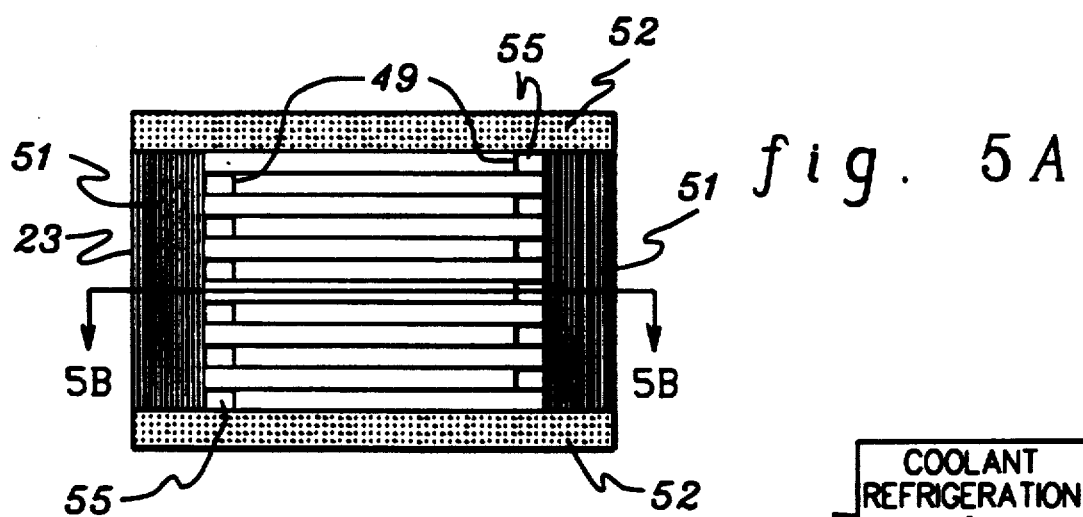
FIG. 5A is a plan view of the chip module of FIG. 4, sitting on a base and having end caps over the faces with the staggered chip edges and a seal.

As also depicted in FIG. 5A, seals 52 are placed along the edges of the gap 29 between the end of caps 51. The seals 52, in conjunction with end caps 51, create a sealed chamber 57 (FIG. 5B) between the module and the base. The sealed chamber 57 has located therein the solder bumps 24.

As depicted in FIG. 5A, recesses 55 are not fully closed by caps 51, since they are the recesses formed by the end chip. Accordingly, the openings between recesses 55 and chamber 57 can be sealed to prevent leakage of coolant. As an alternative, recesses 55 can be sealed along their open side to turn them into additional coolant channels 49. A third possibility is to make the two end chips of the module slightly larger to eliminate recesses 55.

Figure 5B:
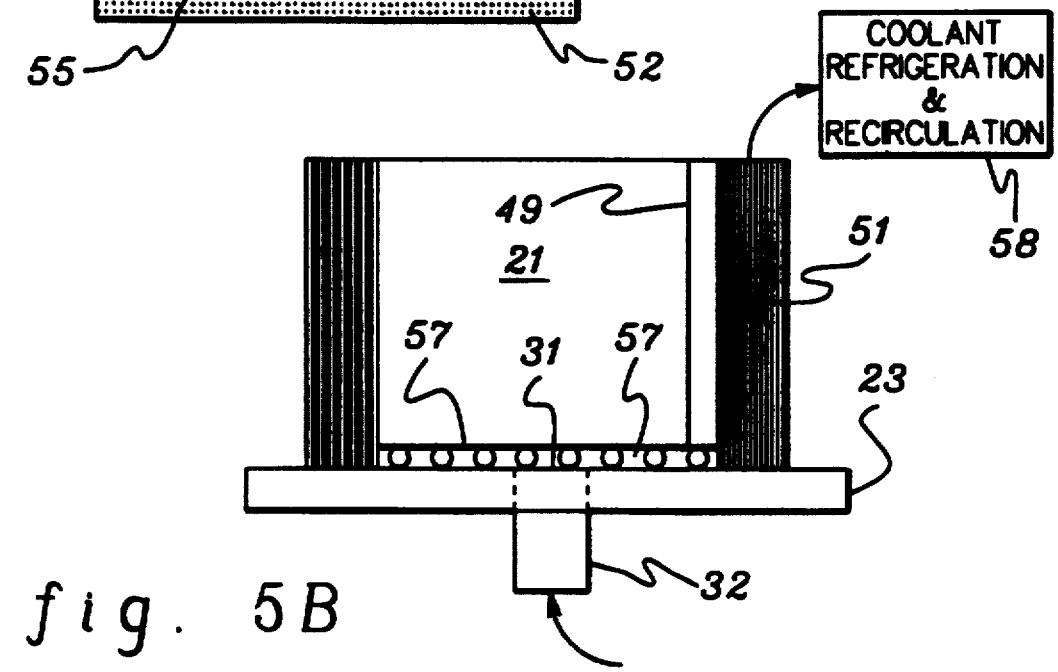
FIG. 5B is a cross-sectional, elevational view taken along line 5B—5B of FIG. 5A.

FIG. 5B depicts, in elevation, a cut-away view of the structure depicted in FIG. 5A along line 5B—5B. As depicted, the caps 51 project all the way to the base 23 to provide effective end seals for the sealed chamber 57. The only openings into the chamber 57 would then be through conduit 32 and opening 31 and the coolant channels 49. Thus coolant can be injected through conduit 32, flow into the chamber 57 around the solder bumps 24, and then up along the sides of the cube through the coolant channels 49 and then out. In this fashion coolant can be circulated around the cube, draw off heat, be conducted to a refrigeration unit 58 or another similar unit, have the excess heat withdrawn and then be recirculated around the chip module. By such means, a module can be effectively and efficiently cooled.

An appropriate structure can be constructed at the top of the module 21 to collect the coolant as it flows out of the coolant channels 49. The flow of the coolant could also be reversed and made to flow into the coolant channels 49 at the top of the module 21, down the channels 49, into the chamber, 57, and then out conduit 32. Mechanisms and structures that can be used to extract heat from the coolant and circulate the coolant are well-known in the art. Such mechanisms would create a pressure differential between the opening in the base and the openings into the coolant channels 49 at the top of module 21 to cause a coolant to flow between the openings.

While the invention has been particularly shown and described with reference to preferred embodiment thereof, it will be understood by those skilled in the art that various changes in form and detail may be made therein without departing from the spirit and the scope of the invention.

We claim:

1. A semiconductor chip package with enhanced cooling comprising:

a plurality of semiconductor chips bonded together in a stack forming a chip module;

a base adjacent to a first exterior face of the chip module, said base and first face being spaced apart by a gap;

a plurality of connecting means in said gap physically and electrically connecting the base to the chip module at a plurality of points on said first face of the chip module; and means for circulating a coolant in the gap between the base and the first face of the chip module around and into thermal communication with the plurality of connecting means to draw heat away from the module through the connecting means, without circulating coolant between adjacent chips of the module.

2. The chip package of claim 1 further comprising:

a low thermal conductivity electrical insulating layer on said exterior face of the chip module above a selected one of the connecting means; and a thermal via extending from said selected one of the connecting means and through said insulating layer above said selected one of the connecting means to the chip module to enhance heat transfer from the module to said selected one of the connecting means.

3. The chip package of claim 2 wherein the connecting means comprise solder bumps.

4. The chip package of claim 3 wherein the thermal via comprises a localized region of an electrical insulator, said localized region exhibiting high thermal conductivity.

5. The chip package of claim 4 wherein the localized region exhibiting high thermal conductivity comprises a modified region of an electrical insulating layer with normally low thermal conductivity.

6. The chip package of claim 5 wherein the modified region is characterized by enhanced localized curing.

7. The chip package of claim 3 further comprising a layer of an electrical insulator with a low thermal conductivity covering said first face elsewhere than at a thermal via location.

8. The chip package of claim 2 further comprising a plurality of thermal vias, each of said thermal vias extending from a different non-signal transmitting one of said connecting means through the insulating layer to said chip module.

9. The chip package of claim 1 wherein adjacent chips of the chip module are staggered such that along two opposite faces of the chip module an edge of every other chip protrudes out from the stack with a recess formed between each pair of successive protruding edges.

10. The chip package of claim 2, wherein the means for circulating the coolant comprises an opening in the base through which coolant flows.

11. The chip package of claim 5, wherein the modified region comprises a region of ion implantation.

12. The chip package of claim 1, wherein the means for circulating a coolant circulates the coolant throughout said gap.

13. A semiconductor chip package with enhanced cooling comprising:

a plurality of semiconductor chips bonded together in a stack forming a chip module, wherein adjacent chips of the chip module are staggered such that along two opposite faces of the chip module an edge of every other chip protrudes out from the stack with a recess formed between each pair of successive protruding edges, and wherein the two opposite faces of the chip module are capped to create a coolant channel along each recess;

a base adjacent to a first exterior face of the chip module, said base and first face being spaced apart by a gap;

a plurality of connecting means in said gap physically and electrically connecting the base to the chip module at a plurality of points on said first face of the chip module;

means for circulating a coolant in the gap between the base and the first face of the chip module around and into thermal communication with the plurality of connecting means to draw heat away from the module through the connecting means; and sealing means to form a sealed chamber between the first face of the chip module and the base, said sealed chamber being in fluid communication with each coolant channel;

and wherein the means for circulating coolant comprises an opening in the base so that coolant can flow through the opening in the base around and into thermal communication with the plurality of connecting means and along each coolant channel.

14. A chip package with enhanced cooling comprising:

a plurality of semiconductor chips bonded together in a stack forming a chip module wherein adjacent chips of the chip module are staggered such that along two opposite first and second faces of the chip module, an edge of every other chip of the module protrudes out from the stack with a recess formed between each pair of successive protruding edges;

a base adjacent to a third face of the chip module; and a plurality of connecting means physically and electrically connecting the base to the chip module at a plurality of points on said third face of the chip module.

15. A chip package with enhanced cooling comprising:

a plurality of semiconductor chips bonded together in a stack forming a chip module wherein adjacent chips of the chip module are staggered such that along two opposite first and second faces of the chip module, an edge of every other chip of the module protrudes out from the stack with a recess formed between each pair of successive protruding edges, and wherein the two opposite first and second faces of the chip module are capped to create a coolant channel along each recess;

a base adjacent to a third face of the chip module; and a plurality of connecting means physically and electrically connecting the base to the chip module at a plurality of points on said third face of the chip module.

16. The package of claim 15, further comprising:

sealing means to form a sealed chamber between the third face of the chip module and the base, said sealed chamber being in fluid communication with each coolant channel; and means for circulating coolant around and into thermal communication with the plurality of connecting means and along each coolant channel.

17. The package of claim 16 further comprising a thermal via extending from a selected one of the connecting means to the chip module to enhance heat transfer from the module to said selected one of the connecting means.

18. The package of claim 17 wherein the connecting means are solder bumps.

19. The package of claim 18 wherein the thermal via comprises a localized region of an electrical insulator, said localized region exhibiting high thermal conductivity.

20. The package of claim 19 wherein the localized region exhibiting high thermal conductivity comprises a modified region of an electrical insulating layer with normally low thermal conductivity.

21. The package of claim 20 wherein the modified region is characterized by enhanced localized curing.

22. The package of claim 18 further comprising a layer of an electrical insulator with a low thermal conductivity covering said third face elsewhere than at a thermal via location.

23. The package of claim 20, wherein the modified region comprises a region of ion implantation.

24. A method for cooling a semiconductor chip module comprising:

forming a chip module from a plurality of stacked staggered semiconductor chips, an edge of every other chip protruding out along one of two opposite first and second faces of the chip module so that recesses are formed between every other chip along the first and second faces, capping the two opposite first and second faces of the chip module such that coolant channels are formed by the caps and the recesses, locating a base adjacent to a third face of the chip module, connecting physically and electrically the base to the chip module at a plurality of points along the third face with connectors such that a chamber is formed between the base and the third face of the chip module, providing a thermal via between the connectors and the chip module at one or more of the connectors, sealing the chamber so that the chamber is in fluid communication with the coolant channels, providing an opening in the base and openings in the cooling channels at a fourth face of the chip module, circulating coolant around the chip module by introducing coolant into the opening in the base and creating a pressure differential between the opening in the base and the openings in the coolant channels at the fourth face so that coolant will flow into the base, around the connectors in the base, up along the coolant channels and out of the coolant channels at the fourth face, collection the coolant at the fourth face and extracting excess heat from the coolant, and then recirculating the coolant about the chip module.

25. A chip package with enhanced cooling comprising:

a plurality of semiconductor chips bonded together in a stack forming a chip module;

a base adjacent to a first exterior face of the chip module, said base and first face being spaced apart by a gap;

a plurality of connecting means in said gap physically and electrically connecting the base to the chip module at a plurality of points on said first face of the chip module;

means for circulating a coolant in the gap between the base and the first face of the chip module around and into thermal communication with the plurality of connecting means to draw heat away from the module through the connecting means; means for peripherally sealing said gap to form a sealed chamber between the base and the first face of the module enclosing the plurality of connecting means; and wherein said means for circulating a coolant comprises pump means for causing the coolant to flow through said chamber and contact the plurality of connecting means in the chamber.

* * * * *

UNITED STATES PATENT AND TRADEMARK OFFICE
CERTIFICATE OF CORRECTION

PATENT NO. : 5,309,318
DATED : May 3, 1994
INVENTOR(S) : Beilstein, Jr. et al.

It is certified that error appears in the above-indentified patent and that said Letters Patent is hereby corrected as shown below:

Col. 2, line 6, delete "by" and insert --be--

Col. 2, line 68, delete ","

Claims:

Claim 24, col. 10, line 55, delete "collection" and insert --collecting--

Signed and Sealed this

Twenty-seventh Day of September, 1994

Attest:

BRUCE LEHMAN

Attesting Officer

Commissioner of Patents and Trademarks